United States Patent
Tatsumi et al.

(10) Patent No.: US 7,411,773 B2
(45) Date of Patent: Aug. 12, 2008

(54) ELECTROSTATIC CHUCKING DEVICE AND MANUFACTURING METHOD THEREOF

(75) Inventors: Yoshiaki Tatsumi, Kanagawa (JP); Kinya Miyashita, Kanagawa (JP)

(73) Assignees: Creative Technology Corporation, Kanagawa (JP); Kawamura Sangyo Co., Ltd., Mie (JP)

( * ) Notice: Subject to any disclaimer, the term of this patent is extended or adjusted under 35 U.S.C. 154(b) by 0 days.

(21) Appl. No.: 10/774,472

(22) Filed: Feb. 10, 2004

(65) Prior Publication Data

US 2004/0160021 A1   Aug. 19, 2004

Related U.S. Application Data

(62) Division of application No. 09/925,739, filed on Aug. 10, 2001, now Pat. No. 6,813,134.

(30) Foreign Application Priority Data

Aug. 16, 2000   (JP) .............................. 246740/2000

(51) Int. Cl.
*H01G 23/00* (2006.01)
*B32B 17/10* (2006.01)

(52) U.S. Cl. .................. 361/234; 428/334; 428/339; 428/450; 428/473.5

(58) Field of Classification Search .............. 428/474.4, 428/474.7, 473.5, 334, 339, 447, 448, 450, 428/458; 361/233, 234
See application file for complete search history.

(56) References Cited

U.S. PATENT DOCUMENTS

| 4,645,218 A | 2/1987 | Ooshio et al. ............ 279/1 M |
| 5,494,522 A | 2/1996 | Moriya et al. |
| 5,547,539 A | 8/1996 | Arasawa et al. .......... 156/626.1 |
| 5,622,593 A | 4/1997 | Arasawa et al. ............. 156/345 |
| 5,645,921 A | 7/1997 | Matsunaga et al. .......... 428/209 |
| 5,691,876 A * | 11/1997 | Chen et al. ................... 361/234 |
| 5,745,331 A | 4/1998 | Shamouilian et al. |
| 5,851,641 A | 12/1998 | Matsunaga et al. .......... 428/209 |
| 5,908,334 A | 6/1999 | Chen et al. |
| 6,027,629 A * | 2/2000 | Hisamoto et al. ............. 205/50 |
| 6,071,630 A | 6/2000 | Tomaru et al. .............. 428/627 |

(Continued)

FOREIGN PATENT DOCUMENTS

EP   0 725 426 A2   8/1996

(Continued)

OTHER PUBLICATIONS

Abstract of Japanese Patent Publication No. 02-027748, Jan. 30, 1990.

(Continued)

*Primary Examiner*—Thao Tran
(74) *Attorney, Agent, or Firm*—Arent Fox LLP

(57) ABSTRACT

An electrostatic chucking device having a laminated structure formed by sequentially laminating a first insulation layer, an electrode layer, and a second insulation layer on a metal substrate. The first and second insulation layers are formed from polyimide films. At least one adhesion layer is provided between the metal substrate and the first insulation layer, and is a thermoplastic polyimide-based adhesive film having a film thickness of 5 to 50 μm.

4 Claims, 4 Drawing Sheets

U.S. PATENT DOCUMENTS

| | | | |
|---|---|---|---|
| 6,099,678 A | 8/2000 | Kotato et al. | 156/256 |
| 6,166,897 A | 12/2000 | Matsunaga | 361/234 |
| 6,256,187 B1 | 7/2001 | Matsunaga et al. | 361/234 |
| 6,473,288 B2 * | 10/2002 | Shima et al. | 361/234 |

FOREIGN PATENT DOCUMENTS

| | | |
|---|---|---|
| EP | 0 948 042 A1 | 10/1999 |
| JP | 2000-243823 | 9/2000 |

OTHER PUBLICATIONS

Abstract of Japanese Patent Publication No. 10-209256, Aug. 7, 1998.

Abstract of Japanese Patent Publication No. 10-209257, Aug. 7, 1998.

Abstract of Japanese Patent Publication No. 11-297805, Oct. 29, 1999.

Abstract of Japanese Patent Publication No. 10-212468, Aug. 11, 1998.

* cited by examiner

ELECTROSTATIC CHUCKING DEVICE AND MANUFACTURING METHOD THEREOF

This is a division of application No. 09/925,739 filed Aug. 10, 2001 now U.S. Pat. No. 6,813,134. The disclosure of the prior application(s) is hereby incorporated by reference herein in its entirety.

FIELD OF THE INVENTION AND RELATED ART STATEMENT

The present invention relates to an electrostatic chucking device which attracts and holds a sample such as a wafer or the like using an electrostatic force in various devices used in a semiconductor fabrication process, for example, and a method for manufacturing such electrostatic chucking devices.

In a semiconductor manufacturing process, a sample such as a wafer or the like is required to be processed in vacuum in an etching device, a plasma CVD device, an ion implantation device, an ashing device, an electric beam lithography, an X ray lithography or the like, for example. Here, an electrostatic chucking device is used as means for holding the wafer or the like.

This electrostatic chucking device is, in general, constituted by laminating an electrostatic chucking sheet having a laminar structure which is comprised of a first insulation layer, an electrode layer and a second insulation layer on a metal substrate. A wafer is placed on the second insulation layer of the electrostatic chucking sheet and a high voltage is applied between the wafer and the electrode layer. By making use of an electrostatic attractive force (Coulomb force) which is generated between the wafer and the electrode, the wafer is attracted to and held on a stage. A polyimide film or a ceramic thin plate which exhibits an excellent heat resistance is used as a first insulation layer, a metal vapor-deposited film or a plated film is used as an electrode layer, and polyimide film is used as the second insulation layer. Further, adhesive layers are respectively formed between the metal substrate and the first insulation layer, between the first insulation layer and the electrode layer, and between the electrode layer and the second insulation layer.

In such an electrostatic chucking device, it is necessary to maintain a wafer surface temperature at a low temperature by efficiently dissipating heat energy generated in the inside of the wafer in use. Accordingly, various means have been proposed to cope with this task.

For example, Japanese Patent Publication 87177/1993 proposes a technique which enhances the thermal conductivity of the whole electrostatic chucking device by making a thickness of an electrostatic chucking sheet (first insulation layer, electrode layer and second insulation layer) which is laminated on a metal substrate as thin as possible or by dispersing thermal conductive fillers as thin in one or two adhesive layers which are inserted for adhesion between the metal substrate, the first insulation layer, the electrode layer and the second insulation layer.

Further, Japanese Laid-open Patent Publication 209,256/1998 and Japanese Laid-open Patent Publication 209,257/1998 respectively have proposed an electrostatic chucking device in which a first insulation layer is comprised of an insulation plate made of ceramic, wherein a thermal conductivity is enhanced by making the layer thickness of respective adhesive layers thinner and when an insulation film which constitutes a second insulation layer laminated on a ceramic insulation plate is fatigued, the insulation film can be easily exchanged.

Further, Japanese Laid-open Patent Publication 297,805/1999 has proposed an electrostatic chucking device which can prevent the worsening of the flatness of a wafer attraction surface or the peeling-off of an adhesive layer from a ceramic insulation plate for a long period by using an adhesive containing rubber components and phenol anti-oxidizing agent as a layer which adheres a metal substrate and a first insulation layer which is laminated on the metal substrate and is made of a ceramic insulation plate.

However, in these conventional electrostatic chucking devices, in case the electrostatic chucking device is mounted on a plasma etching device, for example, when its use time exceeds 300 to 600 hours, an electrostatic chucking sheet which is mounted on a metal substrate is usually gradually peeled off from a periphery thereof. Accordingly, the electrostatic chucking sheet loses its flatness and it becomes difficult to bring a wafer into uniform contact with a surface of the electrostatic chucking sheet. This generates the difference in the cooling efficiency depending on portions of the wafer so that it gives rise to the irregularities with respect to the temperature distribution. Particularly, the failure in cooling in an outer peripheral portion of the wafer has a possibility to cause a serious defect such as a seizure of resistor due to overheating.

Further, when the phenomenon that the outer peripheral portion of the electrostatic chucking sheet is peeled off further progresses, the outer peripheral portion is rolled up from a substrate so that a warping force of the electrostatic chucking sheet exceeds an attraction force of the electrostatic chucking device to attract the wafer. Accordingly, a gap is generated between an attraction surface and the wafer even in the state that the wafer is attracted so that He gas which is supplied between the attraction surface and a rear surface of the wafer as a heat transmission medium leaks through this gap. As a result, it is difficult for the electrostatic chucking device to achieve or maintain a given gas pressure so that the wafer cooling ability of the He gas becomes insufficient whereby normal etching processing cannot be performed or a whole device may become inoperable when it is interlocked resulting in the ending of the lifetime of the electrostatic chucking device.

In view of the above, inventors of the present invention have extensively studied a mechanism which generates the problem on the peeling-off of the outer peripheral portion of the electrostatic chucking sheet. As the result of the studies, the inventors have made a following finding. That is, when an epoxy-based adhesive, a rubber-based adhesive, a modified polyester-based adhesive or the like is used as material of the adhesive layers formed for adhesion between the metal substrate, the first insulation layer, the electrode layer and the second insulation layer, or when an adhesive which contains one or two kinds of copolymers selected from a group consisting of a butadiene-acrylonitrile copolymer, an olefin-based copolymer and a polyphenyl ether copolymer and a hindered phenol-based anti-oxidizing agent is used as such adhesive layers, the adhesive layers are subjected to a severe corrosion from the outer peripheral portions thereof due to plasma particles at the time of performing the plasma etching and hence, only the adhesive layers are gradually burnt out so that the electrostatic chucking sheet is peeled off from the outer peripheral portion. The inventors also have found that this problem is particularly noticeable with respect to the adhesive layer formed for adhesion between the metal substrate and the first insulation layer.

In the electrostatic chucking device which is constituted of the metal substrate, the first insulation layer, the electrode layer, the second insulation layer and the adhesive layers, the heat resistance of the adhesive layers is lower than that of the other constituent members and hence, an upper limit of the use temperature of the electrostatic chucking device is determined based on the heat resistance of the adhesive layers.

Accordingly, as the adhesive layers, the use of an adhesive which exhibits the excellent heat resistance such as a polyimide-based adhesive, a modified polyamide-based adhesive or a polyamide-imide-based adhesive can be considered.

However, the hardening temperature of such a heat resistant adhesive usually exceeds 300° C. Accordingly, when an aluminum alloy which is subjected to an alumite treatment is used as the metal substrate of the electrostatic chucking device, due to the difference of thermal expansion coefficient between the aluminum alloy and an alumite film (the thermal expansion coefficient of the aluminum alloy being usually approximately three times greater than the thermal expansion coefficient of the alumite film), cracks occur in the alumite film because of heating at the time of adhesive hardening manipulation. In this manner, there also exists a problem that the use of the heat resistant adhesive is limited depending on the kind of the metal substrate.

OBJECT AND SUMMARY OF THE INVENTION

The inventors have further extensively studied means to solve these problems derived from the adhesives and have made a following surprising finding. That is, when a polyimide film is used as a first insulation layer and a second insulation layer and when the adhesion between a metal substrate and the first insulation layer, the adhesion between the first insulation layer and an electrode layer and the adhesion between the electrode layer and the second insulation layer (particularly, the adhesion between a metal substrate and the first insulation layer) are performed using a thermoplastic polyimide-based adhesive film having a film thickness of 5 to 50 µm, the above-mentioned problem that the electrostatic chucking sheet is gradually peeled off from the outer peripheral portion thereof is not generated even when the use time of the electrostatic chucking device exceeds approximately 1000 hours whereby all of the above-mentioned various problems derived from the adhesives can be solved. The present invention has been completed based on such a finding.

Accordingly, it is an object of the present invention to provide an electrostatic chucking device which can exhibit an excellent attraction ability for a long period based on the excellent durability and the excellent heat resistance and, at the same time, can be used for a long time by preventing an electrostatic chucking sheet from being peeled off from an outer peripheral portion thereof even when the electrostatic chucking device is mounted on a plasma etching device or the like, for example, and, further, can prevent an adhesive from generating dust when the adhesive is attacked by plasma and contaminating a periphery of the device and a wafer.

Further, it is another object of the present invention to provide an electrostatic chucking device manufacturing method which is served for manufacturing the above-mentioned electrostatic chucking device.

That is, the present invention is directed to an electrostatic chucking device having a laminated structure which is formed by sequentially laminating a first insulation layer, an electrode layer and a second insulation layer on a metal substrate, wherein the first insulation layer and the second insulation layer are constituted of polyimide films, and at least the adhesion between the metal substrate and the first insulation layer, and, preferably, the adhesions including the adhesion between the first insulation layer and the electrode layer and the adhesion between the electrode layer and the second insulation layer are performed by using thermoplastic polyimide-based adhesive films having a film thickness of 5 to 50 µm.

Further, the present invention is directed to an electrostatic chucking device manufacturing method which includes a step in which a thermoplastic polyimide-based adhesive film having a film thickness of 5 to 50 µm, a polyimide film which constitutes a first insulation layer, a thermoplastic polyimide-based adhesive film having a film thickness of 5 to 50 µm, a metal foil which constitutes an electrode layer, a thermoplastic polyimide-based adhesive film having a film thickness of 5 to 50 µm and a polyimide film which constitutes a second insulation layer are sequentially superposed on a metal substrate and a step in which a low-temperature compression bonding processing is performed at a heating temperature of 100 to 250° C. under pressure so as to form a laminated structure which is constituted by sequentially laminating the first insulation layer, the electrode layer and the second insulation layer on the metal substrate.

Still further, the present invention is directed to an electrostatic chucking device manufacturing method which includes a step in which a polyimide film which constitutes a first insulation layer, a thermoplastic polyimide-based adhesive film having a film thickness of 5 to 50 µm, a metal foil which constitutes an electrode layer, a thermoplastic polyimide-based adhesive film having a film thickness of 5 to 50 µm and a polyimide film which constitutes a second insulation layer are sequentially superposed, a step in which a low-temperature compression bonding processing is performed at a heating temperature of 100 to 250° C. under pressure so as to form an electrostatic chucking sheet which is constituted by sequentially laminating the first insulation layer, the electrode layer and the second insulation layer, a step in which the electrostatic chucking sheet is superposed on a metal substrate by way of a thermoplastic polyimide-based adhesive film having a film thickness of 5 to 50 µm, and a step in which a low-temperature compression bonding processing is performed at a heating temperature of 100 to 250° C. under pressure so as to form a laminated structure which is constituted by sequentially laminating the first insulation layer, the electrode layer and the second insulation layer on the metal substrate.

In the present invention, as the metal substrate which constitutes the electrostatic chucking device, an aluminum substrate made of an aluminum alloy or the like is used. However, according to the present invention, the first insulation layer, the electrode layer and the second insulation layer are respectively laminated on the metal substrate at a heating temperature of 100 to 250° C., that is, at a low temperature and hence, by performing the lamination with a relatively low temperature condition of approximately 100° C. in particular, there is no possibility that cracks occur in an alumite film due to the difference in the thermal expansion coefficient whereby the present invention is applicable to an electrostatic chucking device which uses an aluminum substrate.

Further, the first insulation layer and the second insulation layer used in the present invention are made of polyimide films. With respect to the polyimide film which constitutes the insulation layer, a polyimide film which has been used conventionally in this type of electrostatic chucking device, exhibits the withstand voltage characteristics and has the excellent heat resistance of not less than 200° C. is preferably used. To be more specific, CAPTON (name of product produced by Toray•Dupont Ltd.), UPILEX (name of product produced by Ube Kosan Ltd.), NITOMID (name of product produced by Nitto Denki Kogyo. Ltd.), APICAL (name of product produced by Kanegafuchi Kagaku Kogyo Ltd.) and the like can be named. Further, the film thickness of the polyimide film which constitutes the insulation layer is usually set to 5 to 70 μm and is preferably set to 20 to 50 μm. When the film thickness is smaller than 5 μm, the dielectric breakdown is liable to occur and when the film thickness exceeds 70 μm, there arises a problem that the attraction voltage has to be increased and hence, such film setting is not preferable.

Further, as the electrode layer which is used in the present invention, a metal foil which is made of metal such as silver, platinum, palladium, copper, aluminum, tin, nickel, molybdenum, magnesium, tungsten or the like and has a film thickness of 5 to 50 μm, and preferably 10 to 20 μm is used. With respect to the film thickness of the electrode layer, when the film thickness is thinner than 5 μm, the handling of the electrode layer in manufacturing becomes difficult, while when the film thickness is thicker than 50 μm, there arises a problem that a gap is formed on a side surface of the electrode which is covered with the polyimide film. With respect to the electrode layer, the layer is not always made of the metal foil. For example, the electrode layer may be provided by forming a metal layer on the polyimide film which constitutes the first or second insulation layer by means of vapor deposition or plating. In such a case, no adhesion by means of the thermoplastic polyimide-based adhesive film is present between the polyimide film which constitutes the first or second insulation layer and the electrode layer.

In the present invention, the adhesion between the metal substrate and the first insulation layer, the adhesion between the first insulation layer and the electrode layer and the adhesion between the electrode layer and the second insulation layer are respectively performed with the use of the thermoplastic polyimide-based adhesion films having a film thickness of 5 to 50 μm, and preferably 10 to 25 μm. When the film thickness of the adhesive film is thinner than 4 μm, there arise problems that the adhesive strength is decreased and the difference of the thermal expansion between respective members which are adhered to each other cannot be absorbed, while when the film thickness of the adhesive film is thicker than 50 μm, there arises a problem that the whole laminated structure becomes excessively thick.

As the thermoplastic polyimide-based adhesive film which is served for this purpose, any film can be used so long as the film provides the excellent adhesive strength and, at the same time, exhibits the excellent heat resistance, the excellent electric characteristics (particularly, insulation characteristics), the excellent chemical resistance and the low thermal expansion characteristics. Although no other particular limitation is made with respect to the use of the adhesive film, it is preferable to use the adhesive film which can be subjected to the low temperature compression bonding processing under pressure at a heating temperature of 100 to 250° C., and preferably at a heating temperature of 100 to 200° C. Particularly, when the metal substrate is made of the aluminum substrate, it is preferable to use the adhesive film which can be subjected to the low temperature compression bonding processing under pressure at a heating temperature of 100 to 120° C. When the heating temperature at the time of performing the compression bonding processing under pressure is lower than 100° C., the adhesive strength may become insufficient. To the contrary, when the heating temperature at the time of performing the compression bonding processing under pressure is higher than 250° C., particularly in the case that the metal substrate is made of the aluminum substrate, large cracks occur in the alumite film thus giving rise to a practically serious problem. As an specific example of such a thermoplastic polyimide-based adhesion film, for example, ESPANEX (name of product of Shinnittetsu Kagaku Ltd.) can be named. This film is a siloxane modified thermoplastic polyimide-based adhesive film which is obtained by a chemical reaction among diamino siloxane, aromatic diamine and tetracarboxylic acid di-anhydrides (Japanese Laid-open Patent Publication 212468/1998).

Although the method for manufacturing the electrostatic chucking device according to the present invention is not particularly limited, the electrostatic chucking device is generally manufactured in accordance with following methods.

That is, the first method is comprised of a step in which a thermoplastic polyimide-based adhesive film having a film thickness of 5 to 50 μm, a polyimide film which constitutes a first insulation layer, a thermoplastic polyimide-based adhesive film having a film thickness of 5 to 50 μm, a metal foil which constitutes an electrode layer, a thermoplastic polyimide-based adhesive film having a film thickness of 5 to 50 μm and a polyimide film which constitutes a second insulation layer are sequentially superposed on a metal substrate and a step in which a low-temperature compression bonding processing is performed at a heating temperature of 100 to 250° C. under pressure so as to form a laminated structure which is constituted by sequentially laminating the first insulation layer, the electrode layer and the second insulation layer on the metal substrate.

Further, the second method is comprised of a step in which a polyimide film which constitutes a first insulation layer, a thermoplastic polyimide-based adhesive film having a film thickness of 5 to 50 μm, a metal foil which constitutes an electrode layer, a thermoplastic polyimide-based adhesive film having a film thickness of 5 to 50 μm and a polyimide film which constitutes a second insulation layer are sequentially superposed, a step in which a low-temperature compression bonding processing is performed at a heating temperature of 100 to 250° C. under pressure so as to form an electrostatic chucking sheet which is constituted by sequentially laminating the first insulation layer, the electrode layer and the second insulation layer, a step in which the electrostatic chucking sheet is superposed on a metal substrate by way of a thermoplastic polyimide-based adhesive film having a film thickness of 5 to 50 μm, and a step in which a low-temperature compression bonding processing is performed at a heating temperature of 100 to 250° C. under pressure so as to form a laminated structure which is constituted by sequentially laminating the first insulation layer, the electrode layer and the second insulation layer on the metal substrate.

The third method is characterized in that, in the above-mentioned second method, the polyimide film which constitutes the first insulation layer and the thermoplastic polyimide-based adhesive film having a film thickness of 5 to 50 μm are preliminarily integrally laminated to form a first laminated sheet, the polyimide film which constitutes the second insulation layer and the thermoplastic polyimide-based adhesive film having a film thickness of 5 to 50 μm are preliminarily integrally laminated to form a second laminated sheet, and a metal foil is inserted between respective adhesive films of the first laminated sheet and the second laminated sheet, and they are subjected to a low-temperature compression bonding processing under pressure at a temperature of 100 to 250° C. so as to form an electrostatic chucking sheet.

In these methods, it is preferable to perform the low-temperature compression bonding processing under the compression condition of a pressure of 2 to 5 MPa, and preferably of a pressure of 3 to 4 MPa in the thicknesswise direction in the atmosphere. When the pressure in the thicknesswise direction is lower than 2 MPa, there arises a problem such as the insufficient adhesive strength or the generation of bubbles. To the contrary, when the pressure in the thicknesswise direction is higher than 5 MPa, there arises a problem such as the occurrence of cracks in the sheet, the deformation of the metal substrate or the like. Further, it is preferable to perform this low-temperature compression bonding processing under the pressure reduced atmosphere of not more than 133 Pa, and preferably not more than 13 Pa and under compression condition in which the pressure in the thicknesswise direction is set to 0.1 to 5 MPa, and preferably 0.5 to 2 MPa. The thermoplastic polyimide-based adhesive film is generally liable to absorb moisture and the moisture contained in the adhesive film is evaporated as vapor at the time of heating. Accordingly, when the low-temperature compression bonding processing is performed in the atmosphere, voids are generated in addition to the entanglement of air and hence, the thermocompression bonding processing at a relatively high pressure becomes necessary. However, when the low-temperature compression bonding processing is performed under the reduced pressure, the entanglement of air is not generated and the vapor which is generated is readily removed so that the heated adhesion under the relatively low pressure is sufficient.

The electrostatic chucking device of the present invention can not only exhibit the excellent attraction performance over a long period while ensuring the excellent durability and the excellent heat resistance but also be used over the long period by preventing the electrostatic chucking sheet from being peeled off from the outer peripheral portion thereof even when the electrostatic chucking device is served for a plasma etching device or the like, for example. Further, there is no possibility that the adhesive is attacked by plasma and generates dust which contaminates the periphery of the device and a wafer.

Further, according to the method of the present invention, these electrostatic chucking devices can be easily manufactured industrially.

DETAILED DESCRIPTION OF THE PREFERRED EMBODIMENTS

Figure 1:
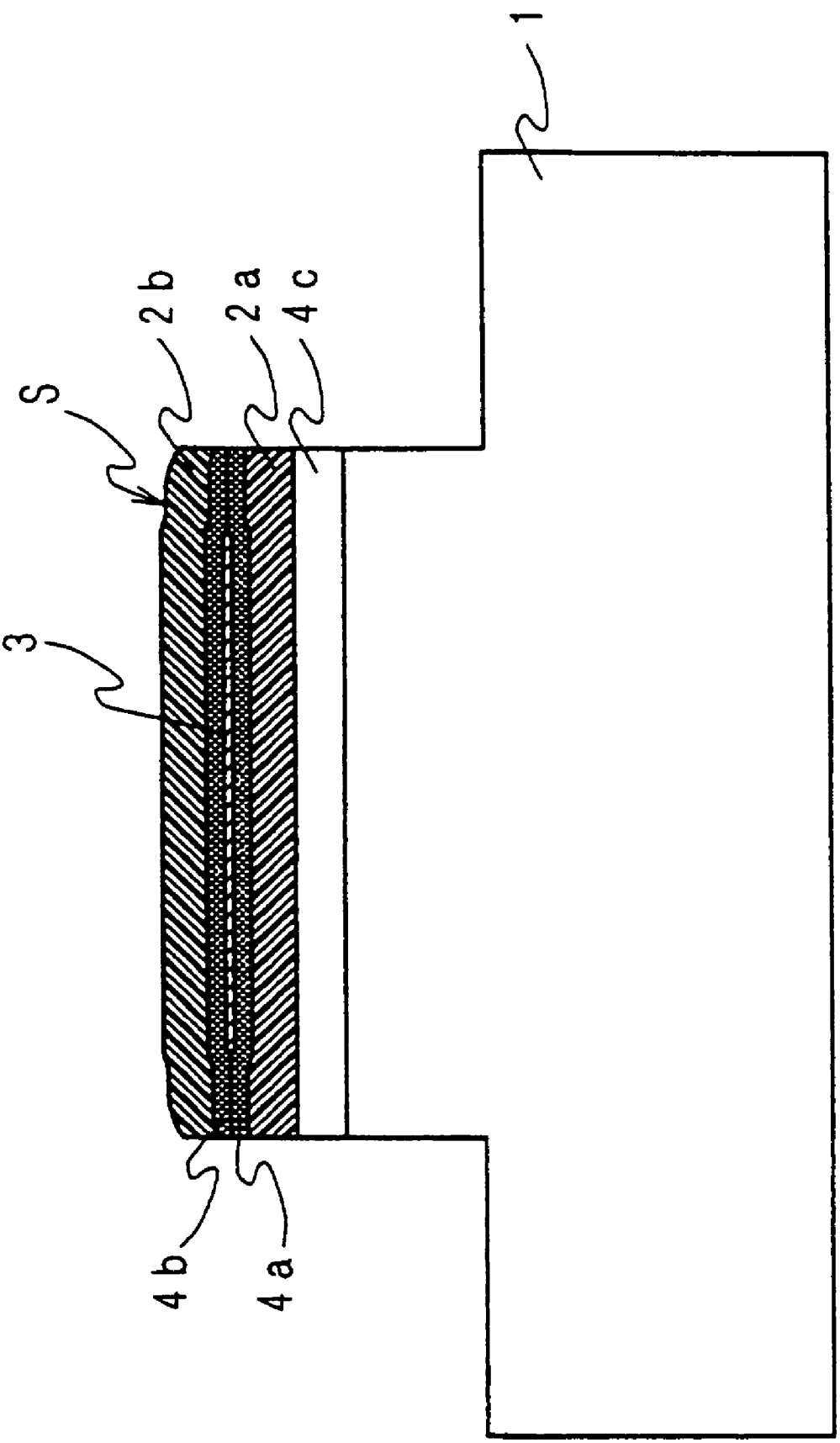
FIG. 1 is a cross-sectional explanatory view of an electrostatic chucking device according to an embodiment 1 of the present invention.

Preferred modes for carrying the present invention are explained specifically hereinafter based on embodiments, comparison examples and experimental examples.

EXAMPLE 1

As a metal substrate 1, an aluminum substrate made of an aluminum alloy (A6061) to which the alumite treatment of a film thickness of 50 μm is applied and which incorporates a water-cooling pipe not shown in the drawing therein is used. As first and second insulation films 2a, 2b, polyimide films having a film thickness of 50 μm (CAPTON H: name of product of, Toray•Dupont Ltd.) are used. Further, as an electrode layer 3, an electrolytic copper foil having a film thickness of 18 μm is used. Further, as thermoplastic polyimide-based adhesive films 4a, 4b, 4c, bonding sheets having a film thickness of 20 μm (trade mark of the product of the Shinnitetsu Kagaku Ltd.: ESPANEX) is used. By laminating them, an electrostatic chucking device having a laminated structure shown in FIG. 1 {the metal substrate (aluminum substrate) 1, the adhesive film (the bonding sheet having a film thickness of 20 μm) 4c, the first insulation layer (the polyimide film having a film thickness of 50 μm) 2a, the adhesive film (the bonding sheet having a film thickness of 20 μm) 4a, the electrode layer (the electrolytic copper foil having a film thickness of 18 μm) 3, the adhesive film (the bonding sheet having a film thickness of 20 μm) 4b and the second insulation layer (the polyimide film having a film thickness of 50 μm) 2b} is formed.

Figure 2:
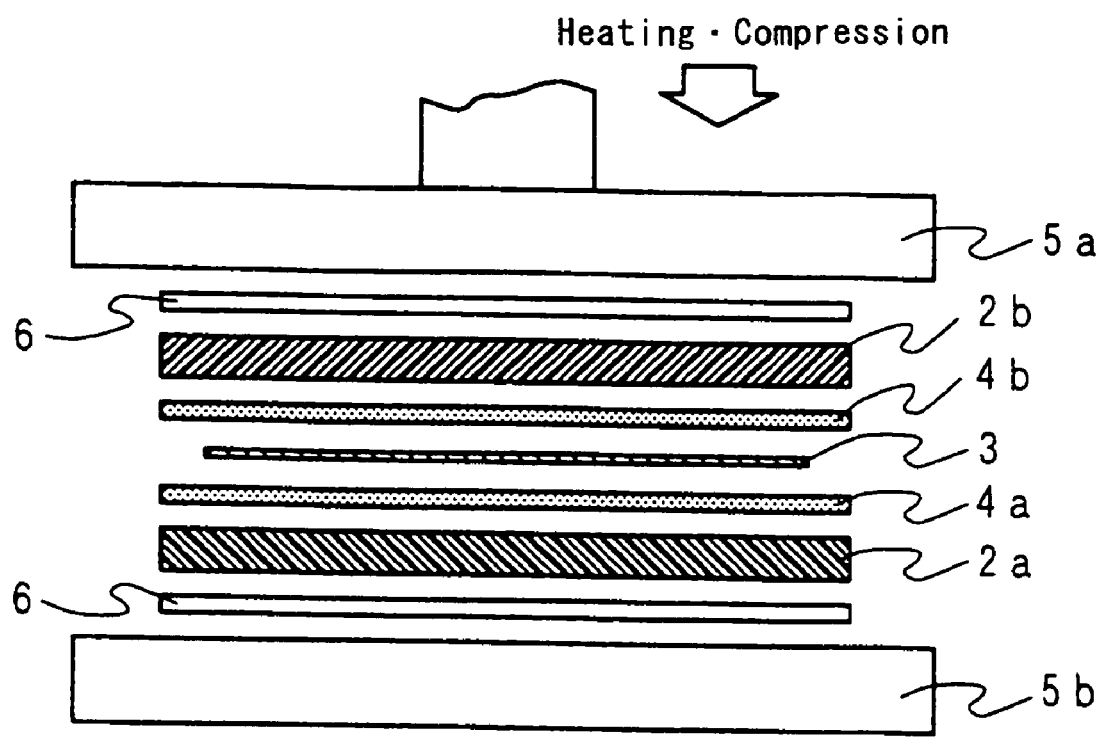
FIG. 2 is a cross-sectional explanatory view showing an electrostatic chucking sheet manufacturing step at the time of manufacturing the electrostatic chucking device shown in FIG. 1.
Figure 3:
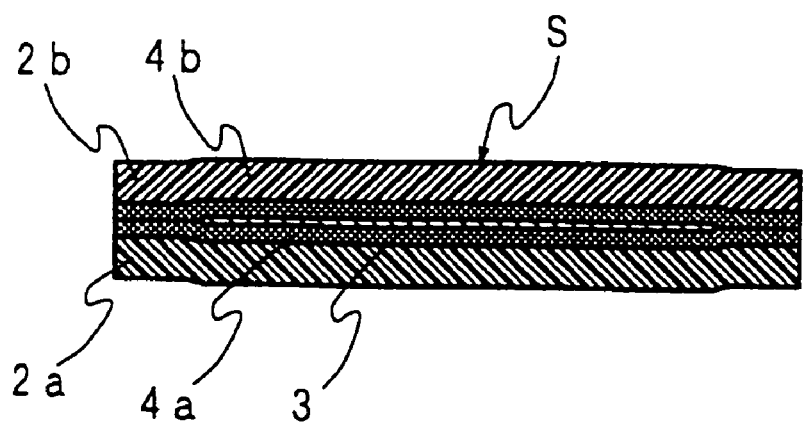
FIG. 3 is a cross-sectional explanatory view showing an electrostatic chucking sheet which is manufactured by the electrostatic chucking sheet manufacturing step shown in FIG. 2.

That is, first of all, as shown in FIG. 2, the polyimide film (film thickness: 50 μm) constituting the first insulation layer 2a which is cut to a size having a diameter of 195 mm, the bonding sheet (film thickness: 20 μm) constituting the thermoplastic polyimide-based adhesive film 4a which is cut to a size having a diameter of 195 mm, the electrolytic copper foil (film thickness 18 μm) constituting the electrode layer 3 which has a diameter of 193 mm, the bonding sheet (film thickness 20 μm) constituting the thermoplastic polyimide-based adhesive film 4b which has a diameter of 195 mm, and the polyimide film (film thickness: 50 μm) constituting the second insulation layer 2b which is cut to a size having a diameter of 195 mm) are sequentially superposed. Further, Teflon sheets 6 having a thickness of 1 mm are respectively superposed on a lower surface side of the first insulation layer 2a and an upper surface side of the second insulation layer 2b as cushion members. This superposed structure is set in a heating press machine 5a, 5b and then is subjected to the heating and compression under conditions that the pressure in the thicknesswise direction is set to 2.2 MPa, the heating temperature is set to 150° C. and the holding time is set to 40 minutes. By removing the Teflon sheets 6, an electrostatic chucking sheet S having a laminated structure shown in FIG. 3 is formed.

Figure 4:
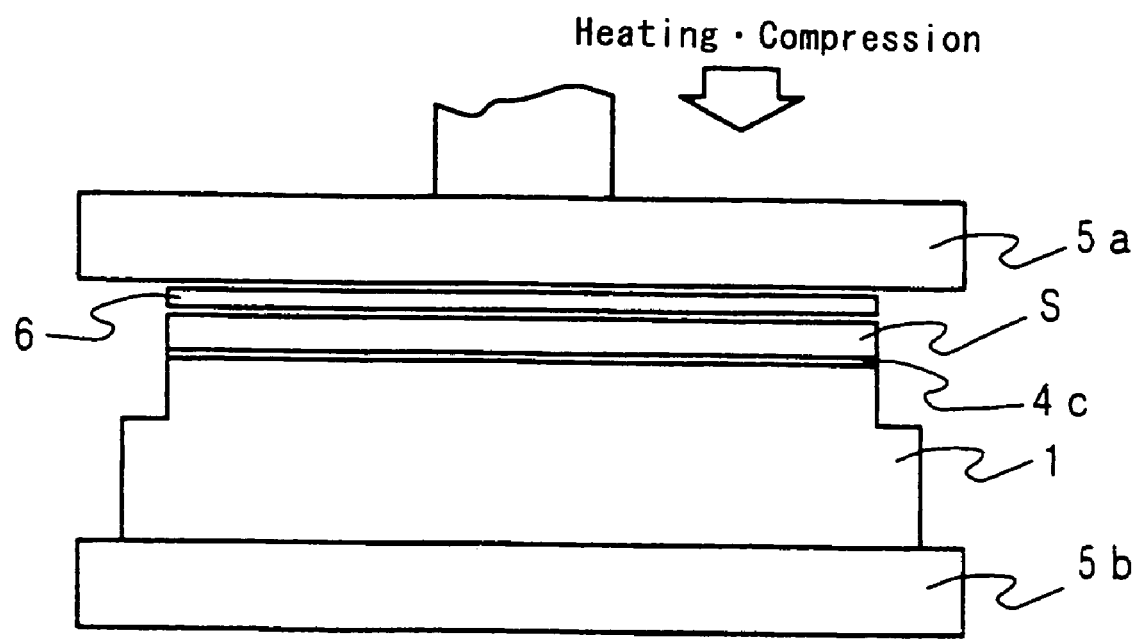
FIG. 4 is a cross-sectional explanatory view showing a step in which the electrostatic chucking sheet and an aluminum substrate are adhered to each other at the time of manufacturing the electrostatic chucking device shown in FIG. 1.

Then, as shown in FIG. 4, a bonding sheet (film thickness: 20 μm) constituting a thermoplastic polyimide-based adhesive film 4c and the electrostatic chucking sheet S obtained in the above-mentioned manner are sequentially superposed on the aluminum substrate (metal substrate) 1. Further, a Teflon sheet 6 having a thickness of 1 mm is superposed on such a superposed structure as a cushion member. This superposed structure is set in the heating press machine 5a, 5b and then is subjected to the heating and compression under conditions that the pressure in the thicknesswise direction is set to 3.0 MPa, the heating temperature is set to 150° C. and the holding time is set to 60 minutes. By removing the Teflon sheet 6, the electrostatic chucking device having a laminated structure shown in FIG. 1 is formed.

EXPERIMENTAL EXAMPLE 1

Figure 5:
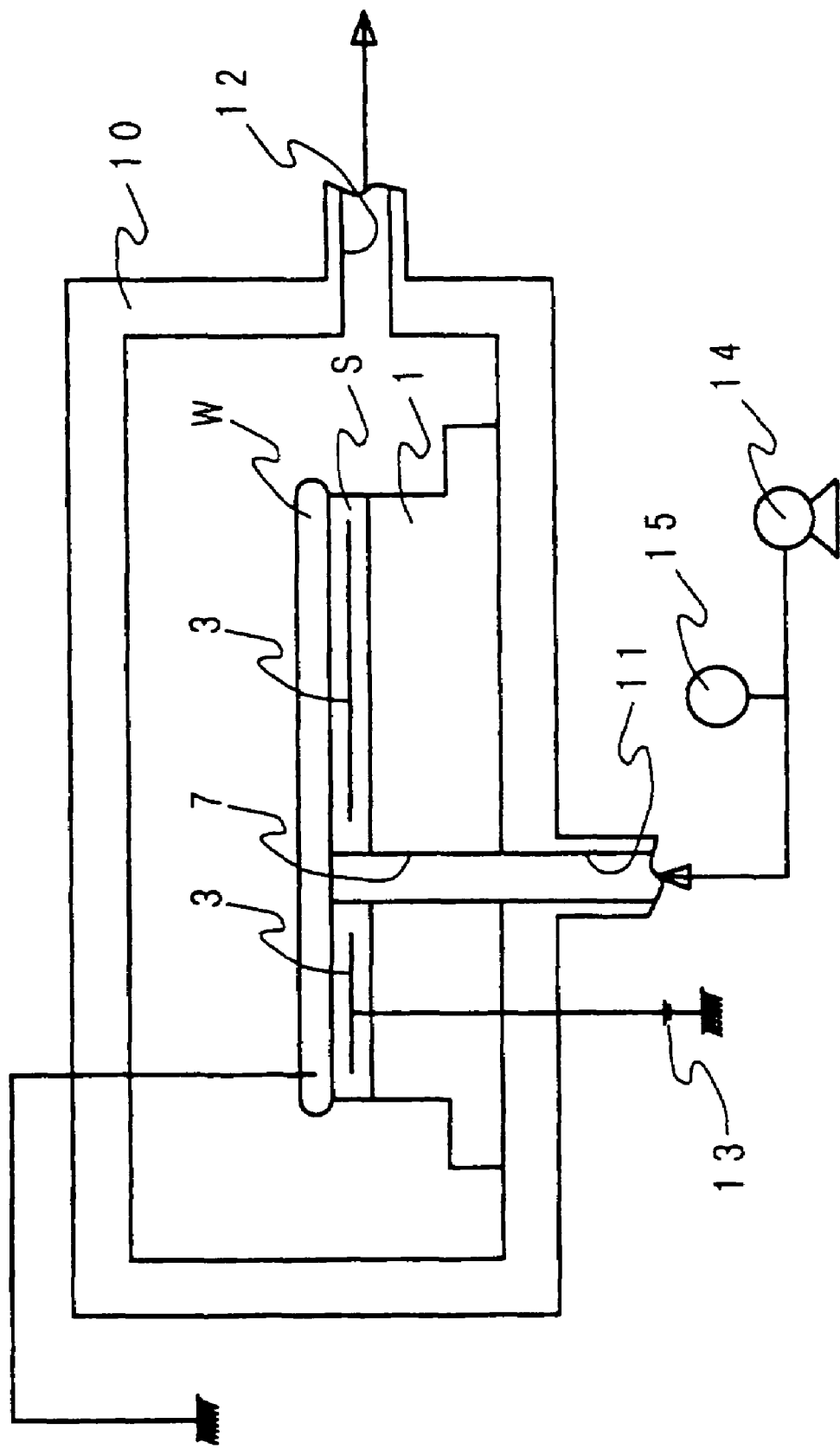
FIG. 5 is a cross-sectional view showing a principle of an electrostatic chucking attraction force measuring device which is used for measuring an attraction force of the electrostatic chucking device in an experimental example 1.

With respect to the electrostatic chucking device obtained by the embodiment 1, an attraction force was measured using an electrostatic chucking attraction force measuring device (made by Creative Technology Ltd.) shown in FIG. 5 and the evaluation on the attraction force was conducted.

First of all, as shown in FIG. 5, in the inside of a vacuum chamber 10 of the measuring device, the electrostatic chucking device is set such that a He gas supply port 11 of the vacuum chamber 10 is communicably connected with a through hole 7 which penetrates the electrostatic chucking device from a lower surface to an upper surface of the electrostatic chucking device. A silicon wafer W is set on the electrostatic chucking sheet S of this electrostatic chucking device. Until the pressure in the inside of the vacuum chamber 10 is reduced to 0.1 Pa, gas is exhausted from an exhaust port 12. In this state, a DC voltage of 1.5 kV is applied to an electrode layer 3 of the electrostatic chucking device from a DC current power supply 13. Further, one end of a lead line is connected to a silicon wafer W and the other end of the lead line is grounded. He gas is supplied to a rear surface of the silicon wafer W at a speed of 10 ml/minute through the He gas supply port 11 and the through hole 7 such that a flow rate of the He gas is adjusted by a flow rate controller 14. The pressure of the He gas filled between an attraction surface of the electrostatic chucking sheet S and the silicon wafer W is measured using a gas pressure gage 15 along with the lapse of time.

The result shows that even when the pressure of the He gas reaches 13000 Pa, the floating of the silicon wafer W is prevented thus proving the sufficient attraction force of the electrostatic chucking device.

EXPERIMENTAL EXAMPLE 2

While maintaining the gas pressure of the He gas in the inside of the vacuum chamber 10 at 1000 Pa, the temperature distribution within a surface of the silicon wafer was measured by using a temperature measurement wafer (name of product produced by Creative Technology Ltd.: Tc wafer) which mounts thermocouples at the center of a 8 inch wafer, at 3 to 9 positions on a circumference having a diameter of 90 mm of the wafer and at 3 to 9 positions on a circumference having a diameter of 180 mm of the wafer so as to measure the temperature distribution at respective positions. The result shows that the temperature distribution within the surface of the silicon wafer was ±1.0° C.

EXPERIMENTAL EXAMPLE 3

Further, the electrostatic chucking device obtained by the embodiment 1 was mounted on an actual parallel flat-plate type plasma etching device and an etching test was performed.

In this parallel flat-plate type plasma etching device, the electrostatic chucking device is installed in the inside of a reaction chamber and an upper shower electrode is disposed right above the electrostatic chucking device. An output of a high frequency power supply having a frequency of 13.56 MHz and an output of 1500 W is connected to the aluminum substrate of the electrostatic chucking device. Further, the upper shower electrode is grounded and a reactive gas pipe is connected to a rear surface of the upper shower electrode to supply reactive gas through shower holes. Further, an output of a DC power supply having a voltage of 1.5 kV is connected to an attraction electrode of the electrostatic chucking device.

On the attraction surface of the electrostatic chucking device installed in the parallel flat-plate type plasma etching device, a silicon wafer to which a given pattern is formed by a photo resist is placed. By exhausting the gas such that the degree of background vacuum becomes 70 Pa, etching gas CHF3 is made to flow from the upper shower electrode at a speed of 50 cm$^3$/minute and a high frequency electric field having a frequency of 13.56 MHz and an output of 1500 W is applied to the aluminum substrate of the electrostatic chucking device so as to generate plasma between the upper shower electrode and the aluminum substrate.

He gas is supplied between the attraction surface of the electrostatic chucking device and the silicon wafer from a through hole which penetrates the electrostatic chucking device at a flow rate of 10 cm$^3$/minute and it was confirmed that the saturated value of the He gas becomes equal to or more than 3000 Pa.

Under such a condition, an etching processing time per 1 sheet of wafer was set to 2 minutes and the continuous processing of wafers was performed while performing a cleaning maintenance approximately every 100 hours.

The result shows that even after the sum of processed sheets exceeds twenty thousand sheets (the total etching time exceeding approximately 660 hours), no abnormal phenomenon such as the peeling off of the sheet from the peripheral portion of the electrostatic chucking device, the abnormal pressure of He gas, the dielectric breakdown of polyimide or the like is observed and the etching speed and the etching shape of the wafer and the like could be held stable for a long period.

EXPERIMENTAL EXAMPLE 4

The polyimide film and the electrolytic copper foil were cut to a size of 5 mm×100 mm and the bonding sheet was cut to a size of 5 mm×50 mm. The bonding sheet was sandwiched between the polyimide film and the electrolytic copper foil at a position 50 mm from an end portion thereof. Then, they were subjected to the heating and the compression under the condition that the pressure in the thicknesswise direction is set to 2 MPa, the heating temperature is set to 150° C. and the holding time is set to 30 minutes so as to prepare a test piece A.

Further, the polyimide film and the electrolytic copper foil having a size of 5 mm×100 mm are cut in the above-mentioned manner and an epoxy adhesive (product of Three Bond Ltd.: Epoxy 2230) having a thickness of 20 μm are coated between these polyimide film and electrolytic copper foil within a range of 50 mm from ends thereof and they are adhered to each other by heating at a temperature of 100° C. for 30 minutes and subsequently at a temperature of 150° C. for 30 minutes thus preparing a test piece B.

Using a peeling strength testing machine, a peeling test was conducted with respect to the test pieces obtained in the above-mentioned manner under the condition that an angle is set to 180° and the a pulling speed is set to 50 mm/min. The result shows that the peeling strength was 0.76 kg/cm with respect to the test piece A and the peeling strength was 0.45 kg/cm with respect to the test piece B. From this result, it was found that compared to the adhesive strength of the conventional epoxy adhesive which was used in the test piece B, the adhesive strength of the bonding sheet of the present invention which was used in the test piece A is increased by approximately 70%.

COMPARISON EXAMPLE 1

Except for that fact that an epoxy adhesive (name of product produced by Three Bond Ltd.: EPOXY 2230) is used in place of the thermoplastic polyimide-based adhesive film, the electrostatic chucking device was prepared in the same manner as the above-mentioned embodiment 1.

When the obtained electrostatic chucking device was used in the actual machine in the same manner as the experimental example 3, the result shows that after the sum of processed sheets exceeds twelve thousand sheets (the total etching time exceeding approximately 400 hours), the peeling off of the sheet was started from the peripheral portion of the electrostatic chucking device.

What is claimed is:

1. An electrostatic chucking device having a laminated structure which is formed by sequentially laminating a first insulation layer, an electrode layer and a second insulation layer on an aluminum alloy metal substrate, wherein the first insulation layer and the second insulation layer are constituted of polyimide films, and an adhesive layer between the aluminum alloy metal substrate and the first insulation layer wherein the adhesive layer includes a diamino siloxane-modified thermoplastic polyimide-based adhesive film having a film thickness of 5 to 50 μm and a compression bonding temperature of 100 to 200° C.

2. An electrostatic chucking device according to claim 1, wherein the adhesive layer between the aluminum alloy metal substrate and the first insulation layer, an adhesive layer between the first insulation layer and the electrode layer and an adhesive layer between the electrode layer and the second insulation layer each includes the diamino siloxane-modified thermoplastic polyimide-based adhesive film having the film thickness of 5 to 50 μm and the compression bonding temperature of 100 to 200° C.

3. An electrostatic chucking device according to claim 1, wherein the polyimide films which constitute the first insulation layer and the second insulation layer have a film thickness of 20 to 50 μm.

4. An electrostatic chucking device according to claim 2, wherein the polyimide films which constitute the first insulation layer and the second insulation layer have a film thickness of 20 to 50 μm.

* * * * *